(12) United States Patent
Takeda

(10) Patent No.: US 7,164,565 B2
(45) Date of Patent: Jan. 16, 2007

(54) ESD PROTECTION CIRCUIT

(75) Inventor: Fujio Takeda, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 292 days.

(21) Appl. No.: 10/723,965

(22) Filed: Nov. 26, 2003

(65) Prior Publication Data

US 2004/0109271 A1 Jun. 10, 2004

Related U.S. Application Data

(60) Provisional application No. 60/429,941, filed on Nov. 29, 2002.

(51) Int. Cl.
*H02H 3/22* (2006.01)

(52) U.S. Cl. .................... 361/56; 361/111

(58) Field of Classification Search .................. 361/56, 361/91.1, 111, 57, 58; 257/355, 356
See application file for complete search history.

(56) References Cited

U.S. PATENT DOCUMENTS

| | | | | |
|---|---|---|---|---|
| 5,255,146 A | * | 10/1993 | Miller | 361/56 |
| 5,535,086 A | * | 7/1996 | Mentzer | 361/56 |
| 5,825,603 A | * | 10/1998 | Parat et al. | 361/111 |
| 5,877,927 A | * | 3/1999 | Parat et al. | 361/56 |
| 5,978,192 A | * | 11/1999 | Young et al. | 361/56 |
| 6,385,021 B1 | * | 5/2002 | Takeda et al. | 361/56 |
| 6,952,333 B1 | * | 10/2005 | Farrenkopf | 361/56 |

* cited by examiner

*Primary Examiner*—Brian Sircus
*Assistant Examiner*—Danny Nguyen
(74) *Attorney, Agent, or Firm*—Garlick Harrison & Markison; Timothy W. Markison

(57) ABSTRACT

An ESD protection circuit for an integrated circuit includes an ESD clamping circuit, an ESD triggering circuit, and an ESD disabling circuit. The ESD clamping circuit is operably coupled to a first power pin of the integrated circuit and a second power pin of the integrated circuit. The ESD triggering circuit is operably coupled to the ESD clamping circuit, wherein, when enabled and when sensing an ESD event, the ESD triggering circuit provides a clamping signal to the ESD clamping circuit such that the ESD clamping circuit provides a low impedance path between the first and second power pins. The ESD disabling circuit is operably coupled to disable the ESD triggering circuit when the integrated circuit is in a normal operating mode.

14 Claims, 5 Drawing Sheets

ESD protection circuitry 60 multi-function handheld device 40

ESD protection circuitry 60

ESD protection circuitry 60

ESD protection circuitry 60

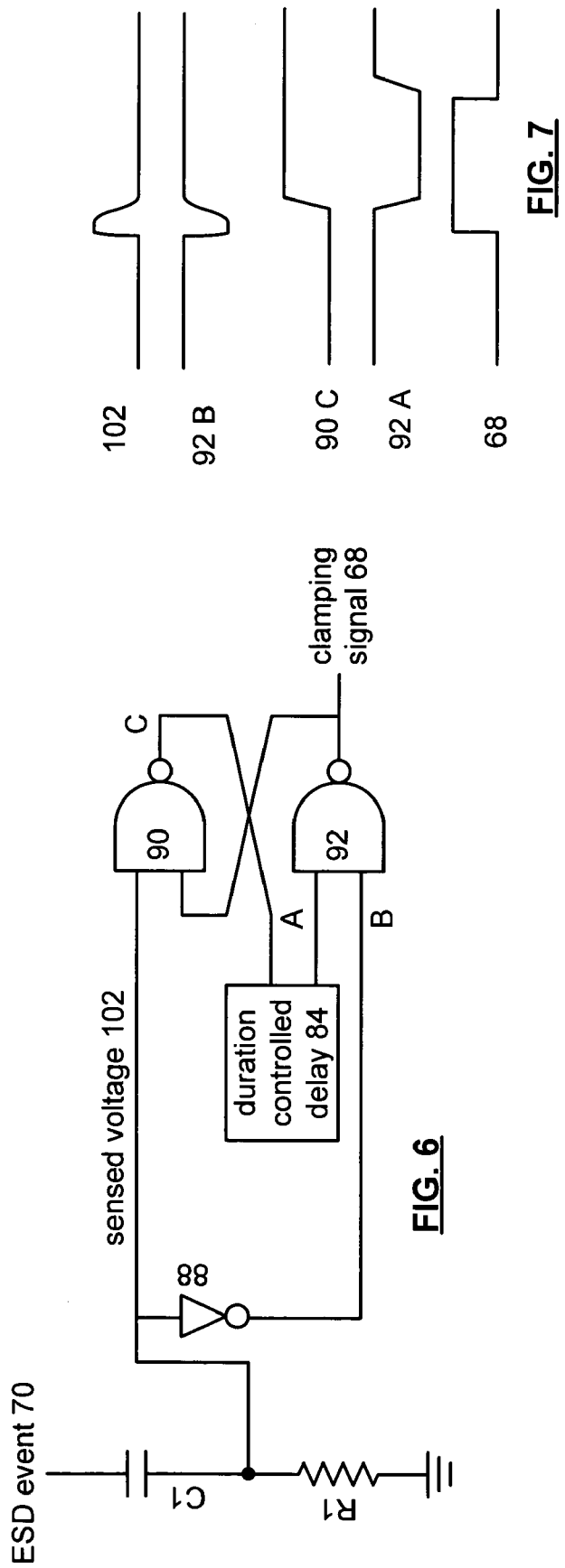
FIG. 6
FIG. 7
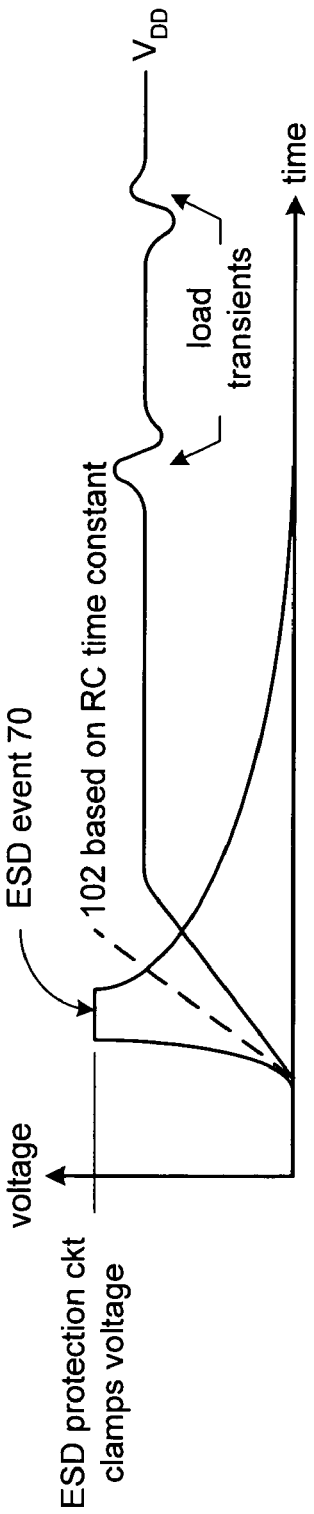
FIG. 8

ESD PROTECTION CIRCUIT

CROSS REFERENCE TO RELATED PATENTS

This patent application is claiming priority under 35 USC § 119 to provisionally filed patent application entitled MULTI-FUNCTION HANDHELD DEVICE, having a provisional serial No. of 60/429,941, and a filing date of Nov. 29, 2002.

BACKGROUND OF THE INVENTION

1. Technical Field of the Invention

This invention relates generally to portable electronic equipment and more particularly to integrated circuits used within such equipment.

2. Description of Related Art

As is known, integrated circuits are used in a wide variety of electronic equipment, including portable, or handheld, devices. Such handheld devices include personal digital assistants (PDA), CD players, MP3 players, DVD players, AM/FM radios, pagers, cellular telephones, computer memory extensions (commonly referred to as thumb drives), etc. Each of these handheld devices includes one or more integrated circuits to provide the functionality of the device. For example, a thumb drive may include an integrated circuit for interfacing with a computer (e.g., personal computer, laptop, server, workstation, etc.) via one of the ports of the computer (e.g., Universal Serial Bus, parallel port, etc.) and at least one other memory integrated circuit (e.g., flash memory). As such, when the thumb drive is coupled to a computer, data can be read from and written to the memory of the thumb drive. Accordingly, a user may store personalized information (e.g., presentations, Internet access account information, etc.) on his/her thumb drive and use any computer to access the information.

As another example, an MP3 player may include multiple integrated circuits to support the storage and playback of digitally formatted audio (i.e., formatted in accordance with the MP3 specification). As is known, one integrated circuit may be used for interfacing with a computer, another integrated circuit for generating a power supply voltage, another for processing the storage and/or playback of the digitally formatted audio data, and still another for rendering the playback of the digitally formatted audio data audible.

As with any integrated circuit, an integrated circuit of a multiple function handheld device includes electrostatic discharge (ESD) protection circuitry. As is known, ESD protection circuitry protects transistors coupled to input and/or output pins of the integrated circuit from electrostatic discharges when the integrated circuit is being handled, transported, etc.

One such ESD protection circuit includes a slope detector and a clamping device. The slope detector senses a slope of the power supply ($V_{DD}$) that is charge up through ESD diode connected between input/output (I/O) Pins and VDD (or an ESD bus) during an ESD event on an I/O pin. When the slope detector senses an ESD event, it provides a signal to enable the clamping device (e.g., a large MOSFET or silicon controlled rectifier (SCR)). The slope detector consists of an RC (resistor/capacitor) delay circuit that should react to an ESD event (e.g., an ESD less than 100 nsec), but should not react to the normal power up of the supply voltage $V_{DD}$ (e.g., about 1µ Sec). If the ESD protection circuit falsely triggers due to a normal power up of the integrated circuit, it clamps the supply voltage low enough shutting off the integrated circuit.

As such, the RC delay should be long enough to sense an ESD event, which could be several hundred nano seconds in a Human Body Model type ESD event. However, with the RC delay set to cover the several hundred nano second ESD event, it may not have sufficient margin to avoid falsely triggering during a normal power up of $V_{DD}$. Further, battery operated devices often experience extreme power surges induced by system level ESD/ EMI (electromagnetic interference), which may cause the ESD protection circuit to falsely trigger.

Therefore, a need exists for an ESD protection circuit that does not falsely trigger when the integrated circuit is active, especially for integrated circuits within multiple function handheld devices.

BRIEF SUMMARY OF THE INVENTION

The electrostatic discharge (ESD) protection circuit of the present invention substantially meets these needs and others. In one embodiment, an ESD protection circuit for an integrated circuit includes an ESD clamping circuit, an ESD triggering circuit, and an ESD disabling circuit. The ESD clamping circuit is operably coupled to a first power pin of the integrated circuit and a second power pin of the integrated circuit. The ESD triggering circuit is operably coupled to the ESD clamping circuit, wherein, when enabled and when sensing an ESD event, the ESD triggering circuit provides a clamping signal to the ESD clamping circuit such that the ESD clamping circuit provides a low impedance path between the first and second power pins. The ESD disabling circuit is operably coupled to disable the ESD triggering circuit when the integrated circuit is in a normal operating mode (i.e., is active). Such an ESD protection circuit does not falsely trigger when the integrated circuit is active.

BRIEF DESCRIPTION OF THE SEVERAL VIEWS OF THE DRAWINGS

FIG. 6 is a schematic block diagram of an ESD triggering circuit in accordance with an embodiment of the present invention;

FIG. 7 is a timing diagram of the operation of the ESD triggering circuit of FIG. 6; and FIG. 8 is a diagram plotting an ESD event, a sensed voltage, and a supply voltage in accordance with the present invention.

DETAILED DESCRIPTION OF THE INVENTION

Figure 1:
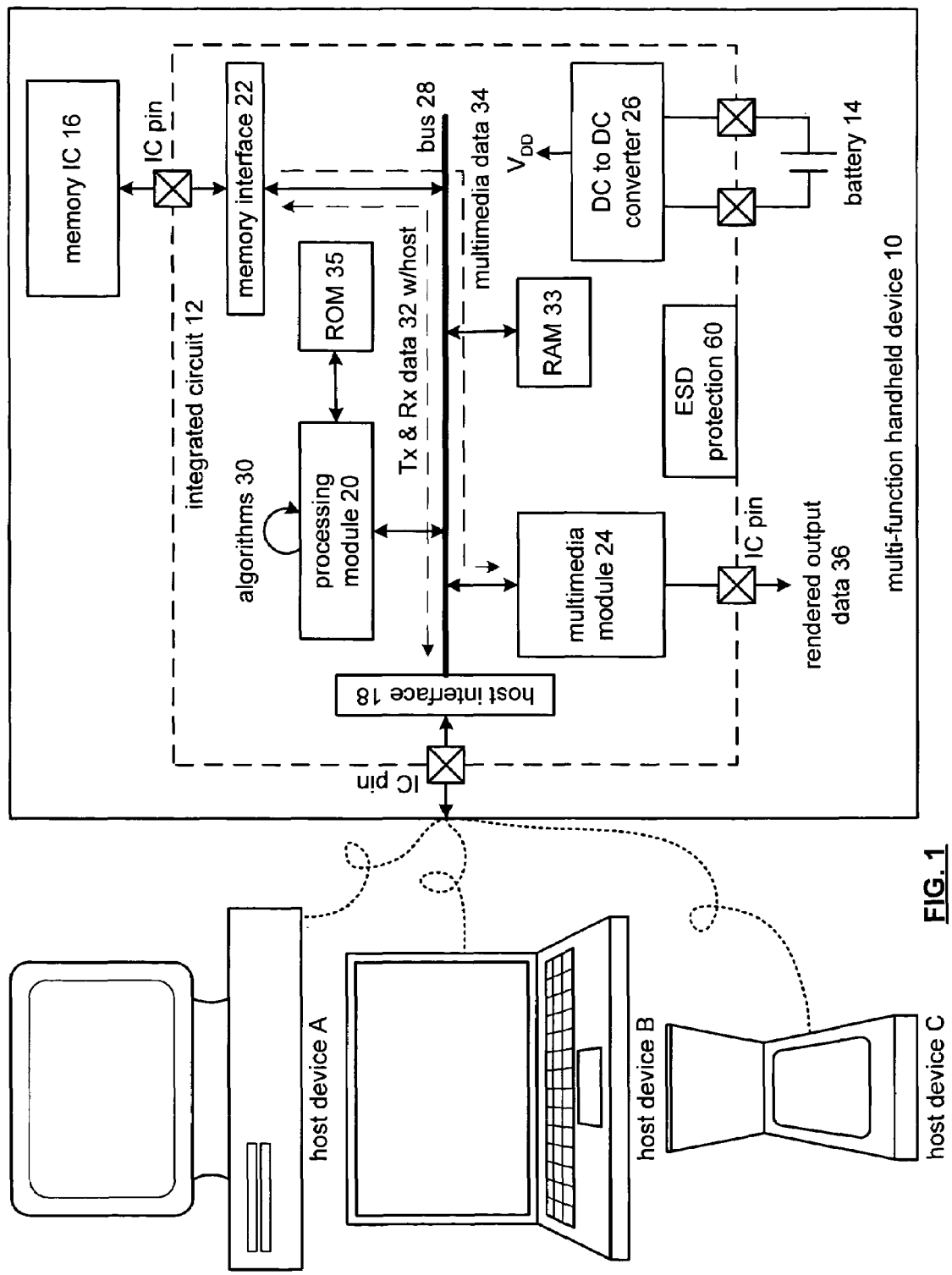
FIG. 1 is a schematic block diagram of a multiple function handheld device in accordance with an embodiment of the present invention.

FIG. 1 is a schematic block diagram of a multi-function handheld device 10 operably coupled to a host device A, B, or C. The multi-function handheld device 10 includes an integrated circuit 12, memory integrated circuit (IC) 16, and a battery 14. The integrated circuit 12 includes a host interface 18, a processing module 20, a memory interface 22, a multimedia module 24, a DC-to-DC converter 26, a bus 28, ESD protection circuit 60 (which will be described in greater detail with reference to FIGS. 3–8), and a plurality of integrated circuit (IC) pins. The multimedia module 24 alone or in combination with the processing module 20 provides the functional circuitry for the integrated circuit 12. The DC-to-DC converter 26, which may be constructed in accordance with the teaching of U.S. Pat. No. 6,204,651, entitled METHOD AND APPARATUS FOR REGULATING A DC VOLTAGE, provides at least a first supply voltage to one or more of the host interface 18, the processing module 20, the multimedia module 24, and the memory interface 22. The DC-to-DC converter 26 may also provide $V_{DD}$ to one or more of the other components of the handheld device 10.

When the multi-function handheld device 10 is operably coupled to a host device A, B, or C, which may be a personal computer, workstation, server (which are represented by host device A), a laptop computer (host device B), a personal digital assistant (host device C), and/or any other device that may transceive data with the multi-function handheld device, the processing module 20 performs at least one algorithm 30, where the corresponding operational instructions of the algorithm 30 are stored in memory 16 and/or in memory incorporated in the processing module 20. The processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

With the multi-function handheld device 10 in the first functional mode, the integrated circuit 12 facilitates the transfer of data between the host device A, B, or C and memory 16, which may be non-volatile memory (e.g., flash memory, disk memory, SDRAM) and/or volatile memory (e.g., DRAM). In one embodiment, the memory IC 16 is a NAND flash memory that stores both data and the operational instructions of at least some of the algorithms 30.

In this mode, the processing module 30 retrieves a first set of operational instructions (e.g., a file system algorithm, which is known in the art) from the memory 16 to coordinate the transfer of data. For example, data received from the host device A, B, or C (e.g., Rx data) is first received via the host interface module 18. Depending on the type of coupling between the host device and the handheld device 10, the received data will be formatted in a particular manner. For example, if the handheld device 10 is coupled to the host device via a USB cable, the received data will be in accordance with the format proscribed by the USB specification. The host interface module 18 converts the format of the received data (e.g., USB format) into a desired format by removing overhead data that corresponds to the format of the received data and storing the remaining data as data words. The size of the data words generally corresponds directly to, or a multiple of, the bus width of bus 28 and the word line size (i.e., the size of data stored in a line of memory) of memory 16. Under the control of the processing module 20, the data words are provided, via the memory interface 22, to memory 16 for storage. In this mode, the handheld device 10 is functioning as extended memory of the host device (e.g., like a thumb drive).

In furtherance of the first functional mode, the host device may retrieve data (e.g., Tx data) from memory 16 as if the memory were part of the computer. Accordingly, the host device provides a read command to the handheld device, which is received via the host interface 18. The host interface 18 converts the read request into a generic format and provides the request to the processing module 20. The processing module 20 interprets the read request and coordinates the retrieval of the requested data from memory 16 via the memory interface 22. The retrieved data (e.g., Tx data) is provided to the host interface 18, which converts the format of the retrieved data from the generic format of the handheld device into the format of the coupling between the handheld device and the host device. The host interface 18 then provides the formatted data to the host device via the coupling.

The coupling between the host device and the handheld device may be a wireless connection or a wired connection. For instance, a wireless connection may be in accordance with Bluetooth, IEEE 802.11(a), (b) or (g), and/or any other wireless LAN (local area network) protocol, IrDA, etc. The wired connection may be in accordance with one or more Ethernet protocols, Firewire, USB, etc. Depending on the particular type of connection, the host interface module 18 includes a corresponding encoder and decoder. For example, when the handheld device 10 is coupled to the host device via a USB cable, the host interface module 18 includes a USB encoder and a USB decoder.

As one of average skill in the art will appreciate, the data stored in memory 16, which may have 64 Mbytes or greater of storage capacity, may be text files, presentation files, user profile information for access to varies computer services (e.g., Internet access, email, etc.), digital audio files (e.g., MP3 files, WMA—Windows Media Architecture—, MP3 PRO, Ogg Vorbis, AAC—Advanced Audio Coding), digital video files [e.g., still images or motion video such as MPEG (motion picture expert group) files, JPEG (joint photographic expert group) files, etc.], address book information, and/or any other type of information that may be stored in a digital format. As one of average skill in the art will further appreciate, when the handheld device 10 is coupled to the host device A, B, or C, the host device may power the handheld device 10 such that the battery is unused.

When the handheld device 10 is not coupled to the host device, the processing module 20 executes an algorithm 30 to detect the disconnection and to place the handheld device in a second operational mode. In the second operational mode, the processing module 20 retrieves, and subsequently executes, a second set of operational instructions from memory 16 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, the multimedia module 24 converts the data 34 into rendered output data 36. For example, the multimedia module 24 may convert digitized data into analog signals that are subsequently rendered audible via a speaker or via a headphone jack. In addition, or in the alternative, the multimedia module 24 may render digital video data and/or digital text data into RGB (red-green-blue), YUV, etc., data for display on an LCD (liquid crystal display) monitor, projection CRT, and/or on a plasma type display.

As one of average skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 2:
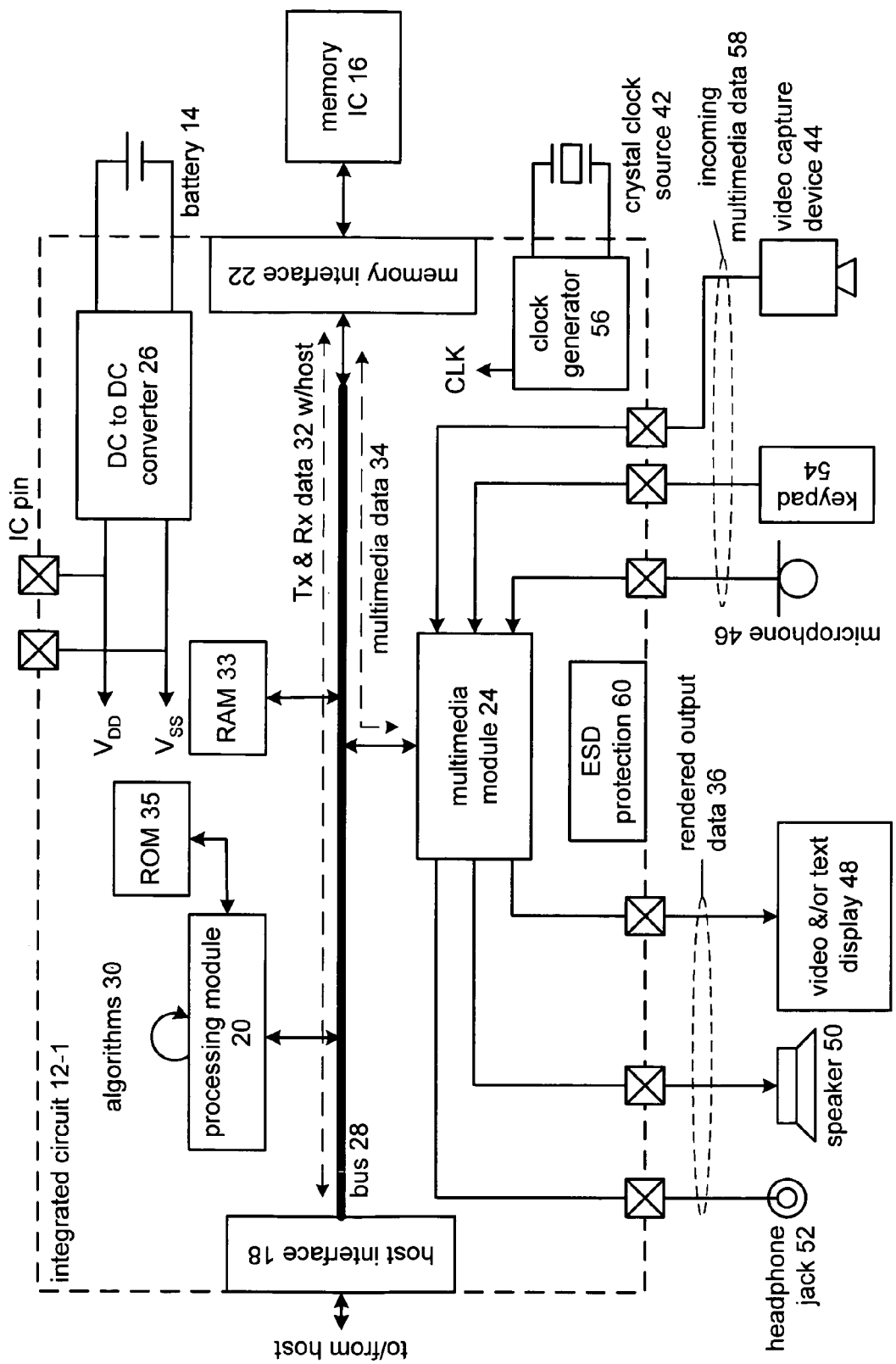
FIG. 2 is a schematic block diagram of a multiple function handheld device in accordance with another embodiment of the present invention.

FIG. 2 is a schematic block diagram of another handheld device 40 and a corresponding integrated circuit 12-1. In this embodiment, the handheld device 40 includes the integrated circuit 12-1, the battery 14, the memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The integrated circuit 12-1 includes the host interface 18, the processing module 20, the memory interface 22, the multimedia module 24, the DC-to-DC converter 26, ESD protection circuit 60 (which will be described in greater detail with reference to FIGS. 3–8), a plurality of IC pins, and a clock generator 56, which produces a clock signal (CLK) for use by the other modules. As one of average skill in the art will appreciate, the clock signal CLK may include multiple synchronized clock signals at varying rates for the various operations of the multi-function handheld device.

Handheld device 40 functions in a similar manner as handheld device 10 when exchanging data with the host device (i.e., when the handheld device is in the first operational mode). In addition, while in the first operational mode, the handheld device 40 may store digital information received via one of the multimedia input devices 44, 46, and 54. For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this extension of the first operational mode, the processing module 20 arbitrates write access to the memory 16 among the various input sources (e.g., the host and the multimedia module).

When the handheld device 40 is in the second operational mode (i.e., not connected to the host), the handheld device may record and/or playback multimedia data stored in the memory 16. Note that the data provided by the host when the handheld device 40 was in the first operational mode includes the multimedia data. The playback of the multimedia data is similar to the playback described with reference to the handheld device 10 of FIG. 1. In this embodiment, depending on the type of multimedia data 34, the rendered output data 36 may be provided to one or more of the multimedia output devices. For example, rendered audio data may be provided to the headphone jack 52 an/or to the speaker 50, while rendered video and/or text data may be provided to the display 48.

The handheld device 40 may also record multimedia data 34 while in the second operational mode. For example, the handheld device 40 may store digital information received via one of the multimedia input devices 44, 46, and 54.

Figure 3:
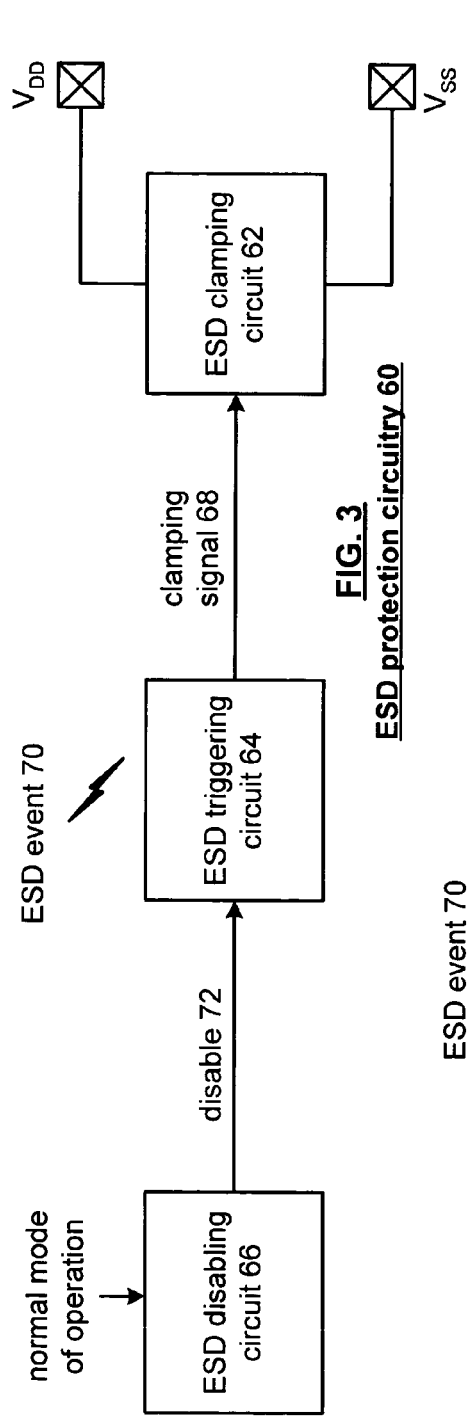
FIG. 3 is a schematic block diagram of an ESD protection circuit in accordance with an embodiment of the present invention.

FIG. 3 is a schematic block diagram of an ESD protection circuit 60 that includes an ESD disabling circuit 66, an ESD triggering circuit 64 and an ESD clamping circuit 62. The ESD clamping circuit 62 is operable coupled to $1^{st}$ and $2^{nd}$ power pins of the integrated circuit. For instance, the $1^{st}$ and $2^{nd}$ power pins may correspond to the supply voltage ($V_{DD}$) and ground ($V_{SS}$). The ESD clamping circuit 62 may be a transistor, surge depressor and/or a silicon controlled rectifier. The ESD clamping circuit 62 provides a low impedance path between the $1^{st}$ and $2^{st}$ power pins based on a clamping signal 68. For example, if the ESD clamping circuit 62 is a transistor, the clamping signal 68 turns on the transistor to provide a low impedance path between $V_{DD}$ and $V_{SS}$. The ESD triggering circuit 64, when enabled, senses an ESD event 70 and, when such an event occurs, produces the clamping signal 68.

The ESD disabling circuit 66 senses the operation of the integrated circuit. When the integrated circuit is off, i.e., no power is applied and thus it is not in a normal mode of operation, the ESD disabling circuit 66 does not provide a signal to the ESD triggering circuit 64. However, when the ESD disabling circuit 66 senses that the integrated circuit is in a normal mode of operation (e.g., when power is applied to the integrated circuit), the ESD disabling circuit 66 provides a disabling signal 72 to the ESD triggering circuit 64. The disabling signal 72 disables the ESD triggering circuit 64 such that the ESD protection circuit 60 is disabled when the integrated circuit is in a normal mode of operation. By disabling the ESD protection circuit during normal mode of operation of the integrated circuit, the ESD protection circuit cannot falsely trigger.

Figure 4:
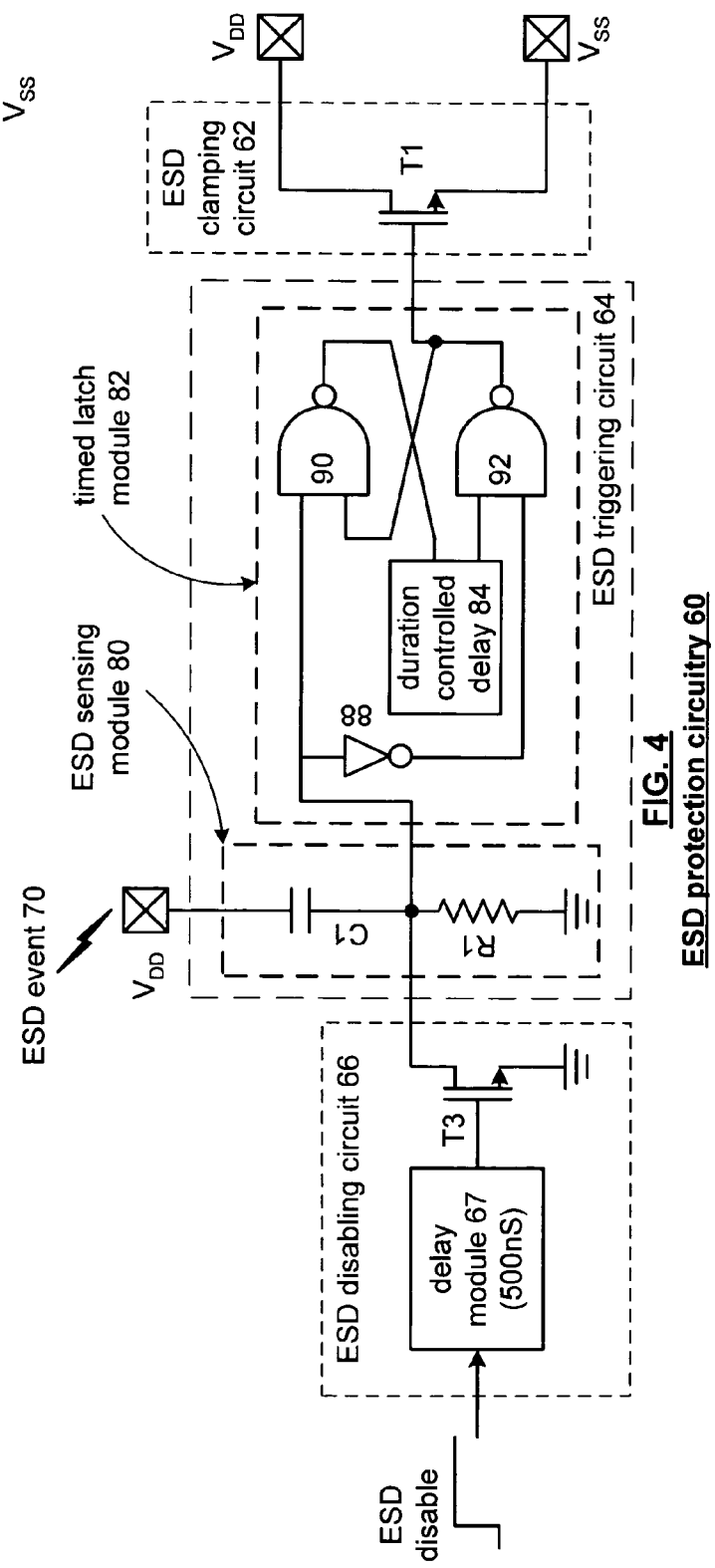
FIG. 4 is a schematic block diagram of an ESD protection circuit in accordance with another embodiment of the present invention.

FIG. 4 is a schematic block diagram of another ESD protection circuit 60 that includes the ESD clamping circuit 62, the ESD triggering circuit 64 and the ESD disabling circuit 66. In this embodiment, the ESD clamping circuit 62 includes a transistor T1. The ESD triggering circuit 64 includes a time latched module 82 and an ESD sensing module 80. The ESD sensing module 80 includes a resistor R1 and a capacitor C1. The time latch module 82 includes an inverter 88, a duration controlled delay 84 and two NAND gates 90 and 92. The ESD disabling circuit 66 includes a transistor T3 and a delay module 67.

In operation, when the integrated circuit is not active (i.e., no power is applied to it), no power is applied to the ESD disabling circuit 66. As such, transistor T3 is off and held off via the delay module 67. In this state, the ESD sensing module 80, which is operably coupled to an integrated circuit pin, is enabled to sense an ESD event 70 on the pin, which may be $V_{DD}$ or any other pin coupled to VDD through a diode. When the ESD sensing module 80 senses an ESD event, it generates a sensed voltage which is supplied to the time latch module 82. The time latch module 82 generates the clamping signal 68 for a duration of time, which turns on transistor T1 thus clamping V to $V_{SS}$ for the duration of time, which is independent of the Resistor-Capacitor (RC) time constant of the ESD sensing module. As such, the RC time constant of the ESD sensing module 80 may be set to be sensitive to ESD events, thus producing a narrow triggering pulse which activates the timed latch as opposed to having to provide the on-pulse to transistor T1 as in prior art ESD protection circuits. Thus, in accordance with the present invention, T1 is enabled for a desired duration of time to ensure proper dissipation of the ESD event while increasing sensitivity to detecting an ESD event.

When the integrated circuit is active (i.e., power is applied to the integrated circuit), the ESD disabling circuit 66 is receiving power. In this mode, the integrated circuit will produce an ESD disable signal, or some other digital signal to indicate that the integrated circuit is active, that may transition high. When the disable signal transitions high, the delay module 67 begins a count, or some other delay mechanism, to delay the rising edge of the ESD disable signal for a specific period of time (e.g., 500 nSec). When the delay ends, the delay module 67 provides a logic one signal to transistor T3. With transistor T3 enabled, resistor RI of the ESD sensing module 80 is effectively shorted to ground and thus cannot produce a sensed voltage 102. As such, any transients on the integrated circuit 10, as may be sensed by the ESD sensing module 80, will not cause a triggering of the ESD clamping circuit 62.

Figure 5:
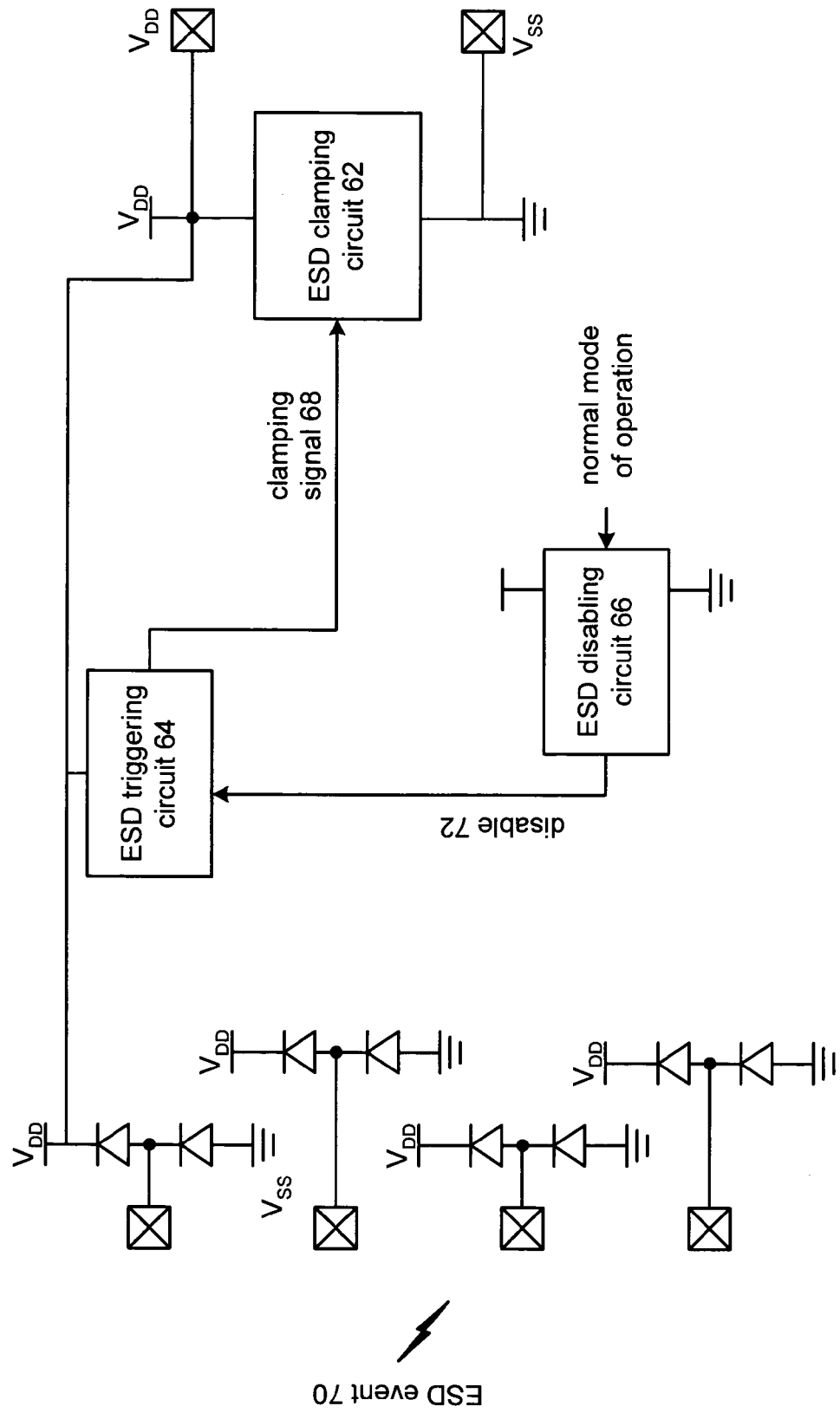
FIG. 5 is a schematic block diagram of an ESD protection circuit in accordance with yet another embodiment of the present invention.

FIG. 5 is a schematic block diagram of yet another embodiment of an ESD protection circuit 60. In this embodiment, the ESD protection circuit 60 includes the ESD clamping circuit 62, the ESD disabling circuit 66, a plurality of diode pairs, and the ESD triggering circuit. In this embodiment, each of the diode pairs is coupled to individual integrated circuit pins. As shown, one of the diodes is reverse bias coupled between the integrated circuit pin and $V_{DD}$ and the other diode is reverse bias coupled between the integrated circuit and $V_{SS}$.

The ESD disabling circuit 66, when the integrated circuit is in a normal mode of operation, produces the disabled signal 72 which disables the ESD triggering circuit 64. When the integrated circuit is not in the normal mode of operation, the ESD disabling circuit 66 does not produce the disabling signal such that the ESD triggering circuit 64 is active.

When any of the ESD triggering circuit senses an ESD event 70 via one of the IC pins via the diode coupled to $V_{DD}$, it generates the clamping signal 68. The ESD clamping circuit 62, in response to the clamping signal 68, provides a low impedance path between $V_{DD}$ and $V_{SS}$.

FIG. 6 is a schematic block diagram of the ESD sensing module 80 and the time latch module 82. As illustrated in FIG. 4, the ESD sensing module 80 includes resistor R1 and capacitor C1. The time latch module 82 includes the inverter 88, the duration controlled delay 84 and two NAND gates 90 and 92. In this embodiment, NAND gates 90 and 92 are coupled to provide a timed latch circuit wherein the time duration of the clamping signal 68 being active is dependent on the timing of the duration controlled delay 84 and independent of the RC time constant of the ESD sensing circuit 80.

In operation, when an ESD event 70 is sensed, a voltage builds up on resistor R1, which is labeled as sense voltage 102. When this voltage rises to a point to represent a logic 1 with respect to NAND gate 90 and inverter 88, the timed latch circuit 82 is activated. With reference to FIG. 7, when the sensed voltage 102 rises from a logic 0 to a logic 1, the first input of NAND gate 92 is transitioned from a high state to a low state via the inverter 88 and the output of NAND gate 90 transitions low to high, which triggers the duration controlled delay 84. The other input of NAND gate 92 is transitioned from a high state to a low state for a predetermined period of time as established by the duration controlled delay 84. While at least one of the inputs to NAND gate 92 are low, the clamping signal 68 is high. As one of average skill in the art will appreciate, the duration that clamping signal 68 is high corresponds to the estimated power of an ESD event such that the energy of the ESD event may be dissipated through the clamping circuit. As one of average skill in the art will further appreciate, there are numerous ways to implement the ESD sensing module and timed latch module 82 to produce the clamping signal 68.

FIG. 8 is a diagram illustrating the ESD event, the sensed voltage 102 that is based on the RC time constant of the ESD sensing circuit (R4 and C1) and the supply voltage $V_{DD}$. As shown, the RC time constant of the ESD sensing circuit 80 should be set such that it produces a sufficient sense voltage 102 during an ESD event but does not produce a sufficient sense voltage 102 as $V_{DD}$ is rising. Accordingly, when an ESD event is detected, the ESD protection circuit clamps the voltage of the ESD event which decays over time through the enabled clamping circuit.

As is further shown in FIG. 8, with $V_{DD}$ is enabled, at some point in time, the load on the integrated circuit will change dramatically, which results in voltage transients on the supply voltage $V_{DD}$. By disabling the ESD protection circuit as described previously with reference to FIGS. 3–7, the load transients do not cause false triggering of the ESD circuit.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented an ESD protection circuit that does not falsely trigger when the integrated circuit is active. As one of average skill in the art will appreciate, other embodiments may be derived from the teaching of the present invention without deviating from the scope of the claims.

What is claimed is:

1. An electrostatic discharge (ESD) protection circuit for an integrated circuit, the ESD protection circuit comprises:
   ESD clamping circuit operably coupled to a first power pin of the integrated circuit and a second power pin of the integrated circuit;
   ESD triggering circuit operably coupled to the ESD clamping circuit, wherein, when enabled and when sensing an ESD event, the ESD triggering circuit provides a clamping signal to the ESD clamping circuit such that the ESD clamping circuit provides a low impedance path between the first and second power pins, the ESD triggering circuit having a first time response to sense the ESD event and a second time response for the clamping signal to activate the ESD clamping circuit, in which the first time response is different than the second time response; and
   ESD disabling circuit operably coupled to disable the ESD triggering circuit when the integrated circuit is in a normal operating mode, wherein the ESD disabling circuit includes an N-channel transistor, in which the source of the N-channel transistor is coupled to ground of the integrated circuit and the drain of the N-channel transistor is coupled to disable the ESD protection circuit when the N-channel transistor is on, and wherein the ESD disabling circuit further includes a delay module operably coupled to enable the N-channel transistor after a delayed sensing of an ESD disable signal.

2. The ESD protection circuit of claim 1, wherein the ESD clamping circuit comprises at least one of: a transistor, a surge suppressor, and a silicon controlled rectifier.

3. The ESD protection circuit of claim 1, wherein the ESD triggering circuit comprises:
   an ESD sensing module operably coupled to sense the ESD event and provide a corresponding sensed voltage based on the first time response; and
   a timed latch module operably coupled to receive the sensed voltage and provide the clamping signal for a given duration based on the second time response.

4. The ESD protection circuit of claim 3, wherein the ESD sensing module comprises:
   a capacitor having a first node and a second node, wherein the first node of the capacitor is operably coupled to a pin of the integrated circuit that is susceptible to the ESD event; and
   a resistor having a first node and a second node, wherein the second node of the resistor is coupled to the first or second power pin of the integrated circuit and the first node of the resistor is coupled to the second node of the capacitor to provide the corresponding sensed voltage, and wherein a time constant of the resistor and the capacitor determines the first time response and is greater than a rise time of the ESD event, is less than a rise time of a power supply of the integrated circuit, and is independent of the given duration of the second time response provided by the time latched module.

5. The ESD protection circuit of claim 3, wherein the timed latch module comprises:
   a first NAND gate having a first input, a second input, and an output, the first input of the first NAND gate is coupled to receive the corresponding sensed voltage;
   an inverter operably coupled to invert the corresponding sensed voltage to produce an inverted corresponding sensed voltage;
   a second NAND gate having a first input, a second input, and an output, wherein the output of the second NAND gate provides the clamping signal and is operably coupled to the second input of the first NAND gate; and
   a duration controlled delay module operably coupled to produce a pulse representation of the output of the first NAND gate, wherein the first input of the second NAND gate is operably coupled to receive the pulse representation of the output of the first NAND gate and the second input of the second NAND gate is operably coupled to receive the inverted corresponding sensed voltage.

6. The ESD protection circuit of claim 1 further comprises:
   the ESD triggering circuit being operably coupled to an input pin or an output pin of the integrated circuit;
   a first diode coupled from the input pin or the output pin to the first power pin; and
   a second diode coupled from the input pin or the output pin to the second power pin.

7. The ESD protection circuit of claim 1 further comprises:
   a plurality of diode pairs operably coupled to a plurality of input pins and output pins, wherein the ESD triggering circuit is operably coupled to the plurality of diode pairs.

8. An integrated circuit of use in a multiple function handheld device, wherein the integrated circuit comprises:
   a processing module operably coupled to perform at least one algorithm relating to a function of the multiple function handheld device;
   a multimedia module operably coupled to produce rendered output data from data corresponding to the processing of the at least one algorithm by the processing module;
   at least one input pin operably coupled to the processing module;
   at least one output pin operably coupled to the multimedia module; and
   electrostatic discharge (ESD) protection circuitry coupled to at least one of the input pin and the output pin, wherein the ESD protection circuitry includes:
   ESD clamping circuit operably coupled to a first power pin of the integrated circuit and a second power pin of the integrated circuit;
   ESD triggering circuit operably coupled to the ESD clamping circuit, wherein, when enabled and when sensing an ESD event, the ESD triggering circuit provides a clamping signal to the ESD clamping circuit such that the ESD clamping circuit provides a low impedance path between the first and second power pins, the ESD triggering circuit having a first time response to sense the ESD event and a second time response for the clamping signal to activate the ESD clamping circuit, in which the first time response is different than the second time response; and
   ESD disabling circuit operably coupled to disable the ESD triggering circuit when the integrated circuit is in a normal operating mode, wherein the ESD disabling circuit includes an N-channel transistor, in which the source of the N-channel transistor is coupled to around of the integrated circuit and the drain of the N-channel transistor is coupled to disable the ESD protection circuit when the N-channel transistor is on, and wherein the ESD disabling circuit further includes a delay module operably coupled to enable the N-channel transistor after a delayed sensing of an ESD disable signal.

9. The integrated circuit of claim 8, wherein the ESD clamping circuit comprises at least one of: a transistor, a surge suppressor, and a silicon controlled rectifier.

10. The integrated circuit of claim 8, wherein the ESD triggering circuit comprises:
   an ESD sensing module operably coupled to sense the ESD event and provide a corresponding sensed voltage based on the first time response; and
   a timed latch module operably coupled to receive the sensed voltage and provide the clamping signal for a given duration based on the second time response.

11. The integrated circuit of claim 10, wherein the ESD sensing module comprises:
   a capacitor having a first node and a second node, wherein the first node of the capacitor is operably coupled to a pin of the integrated circuit that is susceptible to the ESD event; and
   a resistor having a first node and a second node, wherein the second node of the resistor is coupled to the first or second power pin of the integrated circuit and the first node of the resistor is coupled to the second node of the capacitor to provide the corresponding sensed voltage, and wherein a time constant of the resistor and the capacitor determines the first time response and is greater than a rise time of the ESD event, is less than a rise time of a power supply of the integrated circuit, and is independent of the given duration of the second time response provided by the time latched module.

12. The integrated circuit of claim 10, wherein the timed latch module comprises:
   a first NAND gate having a first input, a second input, and an output, the first input of the first NAND gate is coupled to receive the corresponding sensed voltage;
   an inverter operably coupled to invert the corresponding sensed voltage to produce an inverted corresponding sensed voltage;
   a second NAND gate having a first input, a second input, and an output, wherein the output of the second NAND gate provides the clamping signal and is operably coupled to the second input of the first NAND gate; and
   a duration controlled delay module operably coupled to produce a pulse representation of the output of the first NAND gate, wherein the first input of the second NAND gate is operably coupled to receive the pulse representation of the output of the first NAND gate and the second input of the second NAND gate is operably coupled to receive the inverted corresponding sensed voltage.

13. The integrated circuit of claim 8 further comprises:
   the ESD triggering circuit being operably coupled to an input pin or an output pin of the integrated circuit;
   a first diode coupled from the input pin or the output pin to the first power pin; and
   a second diode coupled from the input pin or the output pin to the second power pin.

14. The integrated circuit of claim 8 further comprises:
   a plurality of diode pairs operably coupled to a plurality of input pins and output pins, wherein the ESD triggering circuit is operably coupled to the plurality of diode pairs.

* * * * *